(12) United States Patent
Blanchard

(10) Patent No.: US 7,888,228 B2
(45) Date of Patent: Feb. 15, 2011

(54) METHOD OF MANUFACTURING AN INTEGRATED CIRCUIT, AN INTEGRATED CIRCUIT, AND A MEMORY MODULE

(75) Inventor: Philippe Blanchard, Moigny sur Ecole (FR)

(73) Assignee: Adesto Technology Corporation, Sunnyvale, CA (US)

( * ) Notice: Subject to any disclaimer, the term of this patent is extended or adjusted under 35 U.S.C. 154(b) by 828 days.

(21) Appl. No.: 11/784,206

(22) Filed: Apr. 5, 2007

(65) Prior Publication Data

US 2008/0248380 A1 Oct. 9, 2008

(51) Int. Cl.
H01L 21/00 (2006.01)

(52) U.S. Cl. .................. 438/392; 438/381; 365/148

(58) Field of Classification Search ............ 438/381, 438/392; 365/148
See application file for complete search history.

(56) References Cited

U.S. PATENT DOCUMENTS

| | | | | |
|---|---|---|---|---|
| 6,815,818 B2* | 11/2004 | Moore et al. | ............... | 257/751 |
| 6,838,692 B1* | 1/2005 | Lung | ............................ | 257/4 |
| 7,115,504 B2* | 10/2006 | Moore et al. | ............... | 438/660 |
| 7,115,992 B2* | 10/2006 | Moore et al. | ............... | 257/751 |
| 7,151,273 B2* | 12/2006 | Campbell et al. | ............ | 257/3 |
| 7,167,387 B2* | 1/2007 | Sugita et al. | ............... | 365/148 |
| 7,332,401 B2* | 2/2008 | Moore et al. | ............... | 438/381 |
| 7,368,314 B2* | 5/2008 | Ufert | .......................... | 438/95 |
| 7,374,174 B2* | 5/2008 | Liu et al. | ..................... | 257/5 |
| 7,599,211 B2* | 10/2009 | Blanchard | .................. | 365/148 |
| 7,646,007 B2* | 1/2010 | Campbell et al. | ............ | 257/4 |
| 7,658,773 B2* | 2/2010 | Pinnow | .................... | 29/25.03 |
| 7,723,713 B2* | 5/2010 | Campbell et al. | ............ | 257/2 |
| 2003/0096497 A1* | 5/2003 | Moore et al. | ............... | 438/652 |
| 2003/0173558 A1* | 9/2003 | Campbell | ................... | 257/10 |
| 2004/0149980 A1* | 8/2004 | Campbell | ................... | 257/10 |
| 2004/0232551 A1* | 11/2004 | Moore et al. | ............... | 257/753 |
| 2004/0238958 A1* | 12/2004 | Moore et al. | ............... | 257/751 |
| 2005/0167699 A1 | 8/2005 | Sugita et al. | | |
| 2006/0139989 A1 | 6/2006 | Gruning Von Schwerin et al. | | |
| 2006/0164880 A1* | 7/2006 | Sakamoto et al. | .......... | 365/153 |
| 2006/0199377 A1 | 9/2006 | Ufert | | |

(Continued)

FOREIGN PATENT DOCUMENTS

DE 10 2004 061 548 A1 6/2006

(Continued)

Primary Examiner—Laura M Menz
(74) Attorney, Agent, or Firm—Slater & Matsil, L.L.P.

(57) ABSTRACT

According to one embodiment of the present invention, a method of manufacturing an integrated circuit including a memory device includes, generating a solid electrolyte layer including a first solid electrolyte layer area and a second solid electrolyte layer area, the height of the top surface of the solid electrolyte layer within the second solid electrolyte layer area being lower than the height of the top surface of the solid electrolyte layer within the first solid electrolyte layer area; generating a conductive layer above the top surfaces of the first solid electrolyte layer area and the second solid electrolyte layer area; planarizing the top surface of the conductive layer such that the solid electrolyte layer is exposed within the first solid electrolyte layer area, however is covered by the conductive layer within the second solid electrolyte layer area; patterning the exposed solid electrolyte layer within the first solid electrolyte layer area.

31 Claims, 9 Drawing Sheets

U.S. PATENT DOCUMENTS

| | | |
|---|---|---|
| 2006/0279328 A1* | 12/2006 | Kozicki et al. ................ 326/41 |
| 2008/0029842 A1 | 2/2008 | Symanczyk |
| 2008/0248380 A1* | 10/2008 | Blanchard .................. 429/126 |
| 2008/0253164 A1* | 10/2008 | Blanchard .................. 365/148 |
| 2008/0253165 A1* | 10/2008 | Blanchard .................. 365/148 |
| 2008/0253168 A1* | 10/2008 | Blanchard et al. ........... 365/148 |
| 2008/0304307 A1* | 12/2008 | Gopalakrishnan ............ 365/51 |
| 2010/0259960 A1* | 10/2010 | Samachisa .................. 365/51 |
| 2010/0259961 A1* | 10/2010 | Fasoli et al. ................... 365/51 |
| 2010/0259962 A1* | 10/2010 | Yan et al. ..................... 365/51 |

FOREIGN PATENT DOCUMENTS

| | | |
|---|---|---|
| DE | 10 2005 005 325 A1 | 8/2006 |
| EP | 1 780 728 A2 | 5/2007 |
| WO | WO 2005/041303 A1 | 5/2005 |

\* cited by examiner

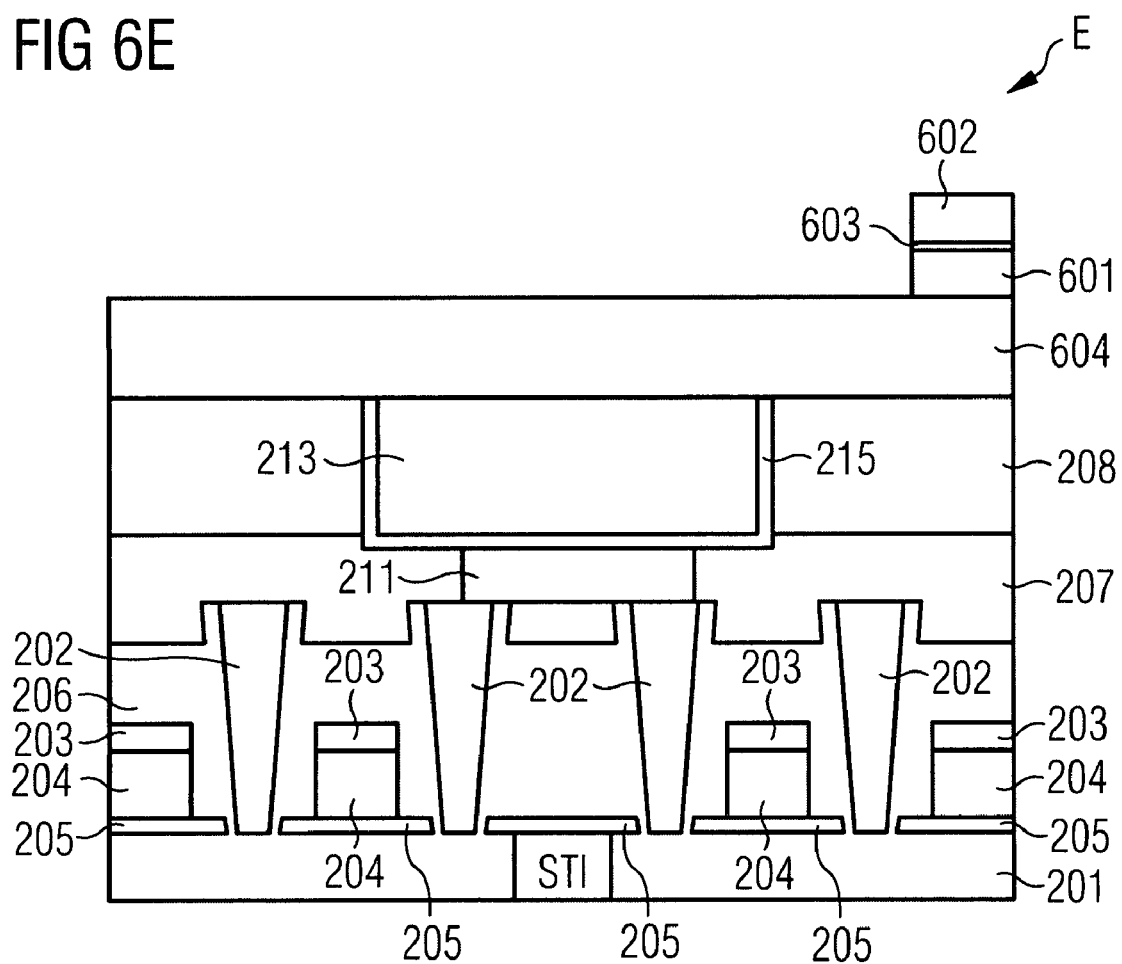

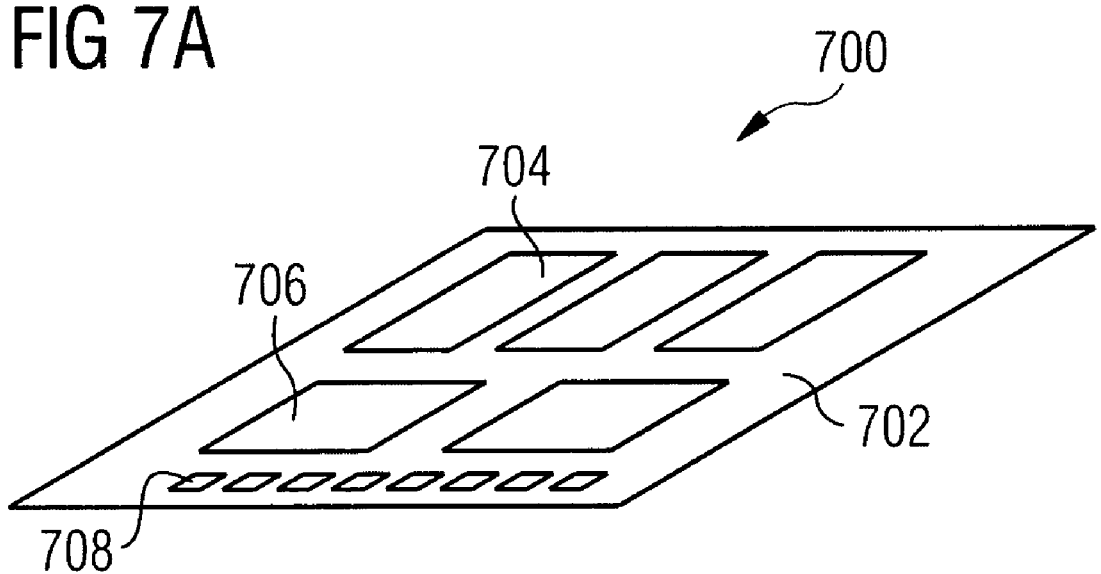
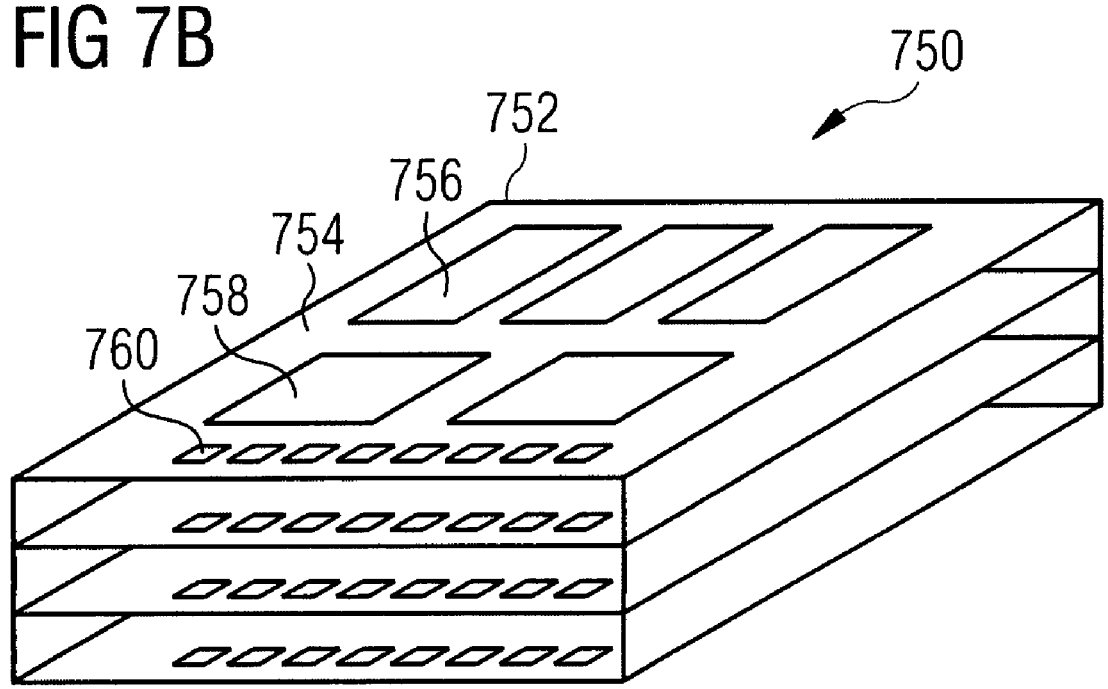

METHOD OF MANUFACTURING AN INTEGRATED CIRCUIT, AN INTEGRATED CIRCUIT, AND A MEMORY MODULE

BRIEF DESCRIPTION OF THE DRAWINGS

For a more complete understanding of exemplary embodiments of the present invention and the advantages thereof, reference is now made to the following description taken in conjunction with the accompanying drawings, in which:

FIG. 6e shows a cross-sectional view of a processing state of a method of fabricating a solid electrolyte memory device according to one embodiment of the present invention;

FIG. 7a shows a perspective view of a memory module according to one embodiment of the present invention; and FIG. 7b shows a perspective view of a memory module according to one embodiment of the present invention.

DETAILED DESCRIPTION OF ILLUSTRATIVE EMBODIMENTS

Figures 1A, 1B:
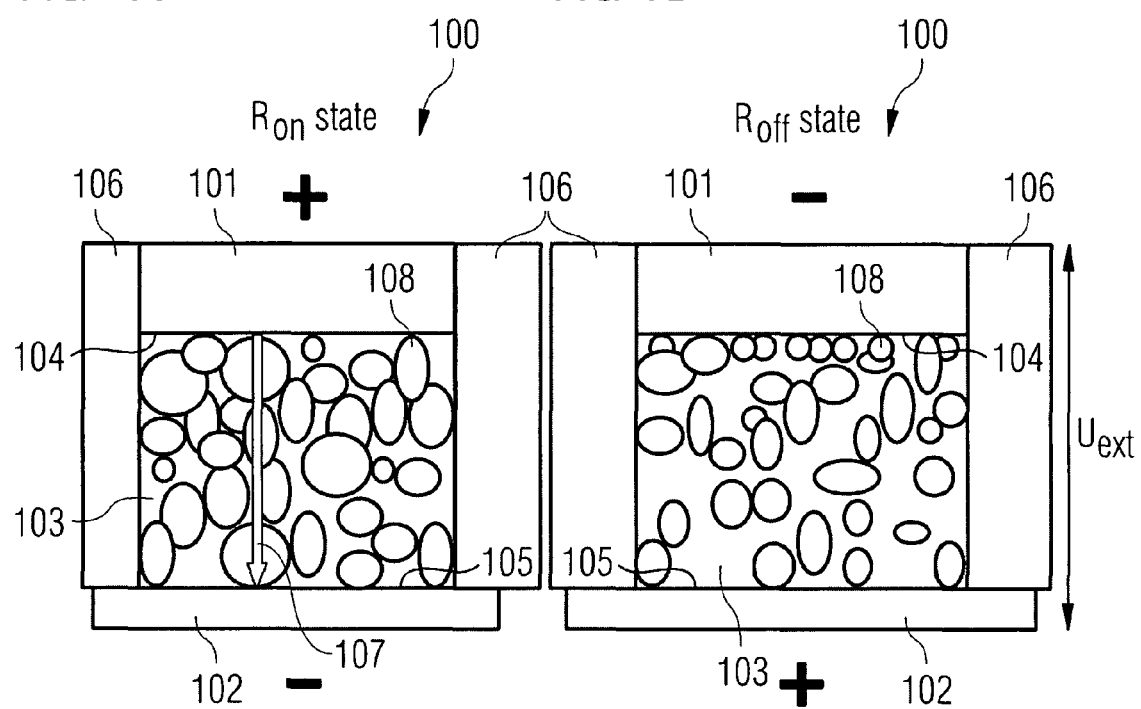
FIG. 1a shows a schematic cross-sectional view of a solid electrolyte memory device set to a first memory state.
FIG. 1b shows a schematic cross-sectional view of a solid electrolyte memory device set to a second memory state.

For sake of simplicity, it will be assumed in the following description that the memory device is a solid electrolyte memory device. However, it is to be understood that the embodiments discussed below are also applicable to other types of memory devices.

According to one embodiment of the present invention, a method of manufacturing a memory device includes generating a solid electrolyte layer including a first solid electrolyte layer area and a second solid electrolyte layer area, the height of the top surface of the solid electrolyte layer within the second solid electrolyte layer area being lower than the height of the top surface of the solid electrolyte layer within the first solid electrolyte layer area; generating a conductive layer above the top surfaces of the first solid electrolyte layer area and the second solid electrolyte layer area; planarizing the top surface of the conductive layer such that the solid electrolyte layer is exposed within the first solid electrolyte layer area, however is covered by the conductive layer within the second solid electrolyte layer area; patterning the exposed solid electrolyte layer within the first solid electrolyte layer area.

According to one embodiment of the present invention, a method of manufacturing an integrated circuit including a memory device is provided, the method including generating a solid electrolyte layer including a first solid electrolyte layer area and a second solid electrolyte layer area, the height of the top surface of the solid electrolyte layer within the second solid electrolyte layer area being lower than the height of the top surface of the solid electrolyte layer within the first solid electrolyte layer area generating a conductive layer above the top surfaces of the first solid electrolyte layer area and the second solid electrolyte layer area planarizing the top surface of the conductive layer such that the solid electrolyte layer is exposed within the first solid electrolyte layer area, however is covered by the conductive layer within the second solid electrolyte layer area; patterning the exposed solid electrolyte layer within the first solid electrolyte layer area.

Within the scope of the present invention, the term, a first layer is disposed "above" a second layer means that the first layer is directly arranged on the second layer, or means that at least one further layer is arranged between the first layer and the second layer.

According to one embodiment of the present invention, the portions of the solid electrolyte layer and the conductive layer located within the second solid electrolyte layer area constitute at least a part of at least one memory cell of the memory device.

According to one embodiment of the present invention, the generation of the solid electrolyte layer includes a process of patterning a solid electrolyte layer having a top surface of a uniform height such that the height of the top surface of the solid electrolyte layer within the second solid electrolyte layer area becomes lower than the height of the top surface of the solid electrolyte layer within the first solid electrolyte layer area.

According to one embodiment of the present invention, the patterning of the exposed solid electrolyte layer is carried out such that the solid electrolyte layer is completely removed within the first solid electrolyte layer area.

According to one embodiment of the present invention, the planarization of the top surface of the conductive layer is carried out using a chemical mechanical polishing process (CMP process).

According to one embodiment of the present invention, the solid electrolyte layer is a solid electrolyte layer composite structure including a first solid electrolyte layer, a second solid electrolyte layer disposed above the first solid electrolyte layer, and an intermediate layer sandwiched between the first solid electrolyte layer and the second solid electrolyte layer.

According to one embodiment of the present invention, the generation of the solid electrolyte layer includes, patterning the second solid electrolyte layer within the second solid electrolyte layer area until the top surface of the intermediate layer is exposed; patterning the exposed intermediate layer until the top surface of the first solid electrolyte layer is exposed.

According to one embodiment of the present invention, the patterning of the exposed solid electrolyte layer within the first solid electrolyte layer includes, patterning the second solid electrolyte layer within the first solid electrolyte layer area until the top surface of the intermediate layer is exposed; patterning the exposed intermediate layer within the first solid electrolyte layer area until the top surface of the first solid electrolyte layer is exposed; patterning the first solid electrolyte layer.

According to one embodiment of the present invention, after having provided the conductive layer, a photo dissolution process and/or a thermal dissolution process is carried out driving metal ions out of the conductive layer into the solid electrolyte layer.

According to one embodiment of the present invention, the conductive layer includes an electrode layer and a contact layer disposed above the electrode layer.

According to one embodiment of the present invention, after having provided the electrode layer, a photo dissolution process and/or a thermal dissolution process is carried out driving metal ions out of the electrode layer into the solid electrolyte layer.

According to one embodiment of the present invention, the intermediate layer includes or consists of nitride or SiC.

According to one embodiment of the present invention, the electrode layer includes or consists of silver.

According to one embodiment of the present invention, the solid electrolyte layer includes or consists of chalcogenide.

According to one embodiment of the present invention, the thickness of the first solid electrolyte layer ranges from 10 nm to 100 nm or from 30 nm to 100 mn.

According to one embodiment of the present invention, the thickness of the second solid electrolyte layer ranges from 10 nm to 100 nm or from 30 nm to 100 mn.

According to one embodiment of the present invention, the thickness of the intermediate layer ranges from 10 Angstrom to 100 Angstrom.

According to one embodiment of the present invention, the thickness of the contact layer ranges from 50 nm to 300 mn.

According to one embodiment of the present invention, the thickness of the electrode layer ranges from 10 Angstrom to 100 Angstrom.

According to one embodiment of the present invention, the second solid electrolyte layer is patterned using an etching process, wherein the intermediate layer serves as an etching barrier during the etching process.

According to one embodiment of the present invention, the thickness of the first solid electrolyte layer corresponds to the target thickness of solid electrolyte layers of memory cells of the memory device.

All embodiments described above can also be applied to the embodiments described in the following.

According to one embodiment of the present invention, a method of manufacturing a memory device is provided, the method including patterning a composite structure including a first solid electrolyte layer, a second solid electrolyte layer disposed above the first solid electrolyte layer, and an intermediate layer sandwiched between the first solid electrolyte layer and the second solid electrolyte layer, the patterning of the composite structure including selectively patterning the second solid electrolyte layer within the second solid electrolyte layer area until the top surface of the intermediate layer is exposed, and selectively patterning the exposed intermediate layer until the top surface of the first solid electrolyte layer is exposed; providing an electrode layer above the top surfaces of the first solid electrolyte layer area and the second solid electrolyte layer area; providing a contact layer above the electrode layer; planarizing the top surface of the contact layer such that the second solid electrolyte layer is exposed within the first solid electrolyte layer area, however is covered by the conductive layer within the second solid electrolyte layer area; patterning the composite structure within the first solid electrolyte layer area, the patterning including patterning the second solid electrolyte layer until the top surface of the intermediate layer is exposed, patterning the exposed intermediate layer until the top surface of the first solid electrolyte layer is exposed, and patterning the first solid electrolyte layer.

According to one embodiment of the present invention, a method of manufacturing an integrated circuit including a memory device is provided, the method including patterning a composite structure including a first solid electrolyte layer, a second solid electrolyte layer disposed above the first solid electrolyte layer, and an intermediate layer sandwiched between the first solid electrolyte layer and the second solid electrolyte layer, the patterning of the composite structure including selectively patterning the second solid electrolyte layer within the second solid electrolyte layer area until the top surface of the intermediate layer is exposed, and selectively patterning the exposed intermediate layer until the top surface of the first solid electrolyte layer is exposed; providing an electrode layer above the top surfaces of the first solid electrolyte layer area and the second solid electrolyte layer area; providing a contact layer above the electrode layer; planarizing the top surface of the contact layer such that the second solid electrolyte layer is exposed within the first solid electrolyte layer area, however is covered by the conductive layer within the second solid electrolyte layer area; patterning the composite structure within the first solid electrolyte layer area, the patterning including patterning the second solid electrolyte layer until the top surface of the intermediate layer is exposed, patterning the exposed intermediate layer until the top surface of the first solid electrolyte layer is exposed, and patterning the first solid electrolyte layer.

According to one embodiment of the present invention, a memory device is provided including a memory cell, the memory cell including a memory cell solid electrolyte layer and a memory cell conductive layer disposed on or above the memory cell solid electrolyte layer, wherein the memory cell solid electrolyte layer and the memory cell conductive layer are generated as follows generating a solid electrolyte layer including a first solid electrolyte layer area and a second solid electrolyte layer area, the height of the top surface of the solid electrolyte layer within the second solid electrolyte layer area being lower than the height of the top surface of the solid electrolyte layer within the first solid electrolyte layer area; generating a conductive layer on or above the top surfaces of the first solid electrolyte layer area and the second solid electrolyte layer area; planarizing the top surface of the conductive layer such that the solid electrolyte layer is exposed within the first solid electrolyte layer area, however is covered by the conductive layer within the second solid electrolyte layer area; patterning the exposed solid electrolyte layer within the first solid electrolyte layer area, wherein the portions of the solid electrolyte layer and the conductive layer located within the first solid electrolyte layer area constitute the memory cell solid electrolyte layer and the memory cell conductive layer.

According to one embodiment of the present invention, an integrated circuit is provided comprising at least one memory device according to an embodiment of the present invention.

According to one embodiment of the present invention, a memory module is provided comprising at least one memory device according to an embodiment of the present invention. According to one embodiment of the present invention, the memory module is stackable.

Since the embodiments of the present invention can be applied to solid electrolyte devices like CBRAM (conductive bridging random access memory) devices, in the following description, making reference to FIGS. 1A and 1B, a basic principle underlying embodiments of CBRAM devices will be explained.

As shown in FIG. 1A, a CBRAM cell 100 includes a first electrode 101, a second electrode 102, and a solid electrolyte block (in the following also referred to as ion conductor block) 103 which includes the active material and which is sandwiched between the first electrode 101 and the second electrode 102. This solid electrolyte block 103 can also be shared between a large number of memory cells (not shown here). The first electrode 101 contacts a first surface 104 of the ion conductor block 103, the second electrode 102 contacts a second surface 105 of the ion conductor block 103. The ion conductor block 103 is isolated against its environment by an isolation structure 106. The first surface 104 usually is the top surface, the second surface 105 the bottom surface of the ion conductor 103. In the same way, the first electrode 101 generally is the top electrode, and the second electrode 102 the bottom electrode of the CBRAM cell. One of the first electrode 101 and the second electrode 102 is a reactive electrode, the other one an inert electrode. Here, the first electrode 101 is the reactive electrode, and the second electrode 102 is the inert electrode. In this example, the first electrode 101 includes silver (Ag), the ion conductor block 103 includes silver-doped chalcogenide material, the second electrode 102 includes tungsten (W), and the isolation structure 106 includes $SiO_2$. The present invention is however not restricted to these materials. For example, the first electrode 101 may alternatively or additionally include copper (Cu) or zinc (Zn), and the ion conductor block 103 may alternatively or additionally include copper-doped chalcogenide material. Further, the second electrode 102 may alternatively or additionally include nickel (Ni) or platinum (Pt), iridium (Ir), rhenium (Re), tantalum (Ta), titanium (Ti), ruthenium (Ru), molybdenum (Mo), vanadium (V), conductive oxides, silicides, and nitrides of the aforementioned compounds, and can also include alloys of the aforementioned metals or materials. The thickness of the ion conductor 103 may, for example, range between 5 nm and 500 nm. The thickness of the first electrode 101 may, for example, range between 10 nm and 100 nm. The thickness of the second electrode 102 may, for example, range between 5 nm and 500 nm, between 15 nm to 150 nm, or between 25 nm and 100 nm. It is to be understood that the present invention is not restricted to the above-mentioned materials and thicknesses.

In the context of this description, chalcogenide material (ion conductor) is to be understood, for example, as any compound containing oxygen, sulphur, selenium, germanium and/or tellurium. In accordance with one embodiment of the invention, the ion conducting material is, for example, a compound, which is made of a chalcogenide and at least one metal of the group I or group II of the periodic system, for example, arsenic-trisulfide-silver. Alternatively, the chalcogenide material contains germanium-sulfide ($GeS_x$), germanium-selenide ($GeSe_x$), tungsten oxide ($WO_x$), copper sulfide ($CuS_x$) or the like. The ion conducting material may be a solid state electrolyte. Furthermore, the ion conducting material can be made of a chalcogenide material containing metal ions, wherein the metal ions can be made of a metal, which is selected from a group consisting of silver, copper and zinc or of a combination or an alloy of these metals.

If a voltage as indicated in FIG. 1A is applied across the ion conductor block 103, a redox reaction is initiated which drives Ag+ ions out of the first electrode 101 into the ion conductor block 103 where they are reduced to Ag, thereby forming Ag rich clusters 108 within the ion conductor block 103. If the voltage applied across the ion conductor block 103 is applied for an enhanced period of time, the size and the number of Ag rich clusters within the ion conductor block 103 is increased to such an extent that a conductive bridge 107 between the first electrode 101 and the second electrode 102 is formed. In case that a voltage is applied across the ion conductor 103 as shown in FIG. 1B (inverse voltage compared to the voltage applied in FIG. 1A), a redox reaction is initiated which drives Ag+ ions out of the ion conductor block 103 into the first electrode 101 where they are reduced to Ag. As a consequence, the size and the number of Ag rich clusters within the ion conductor block 103 is reduced, thereby erasing the conductive bridge 107.

In order to determine the current memory status of a CBRAM cell, for example, a sensing current is routed through the CBRAM cell. The sensing current experiences a high resistance in case no conductive bridge 107 exists within the CBRAM cell, and experiences a low resistance in case a conductive bridge 107 exists within the CBRAM cell. A high resistance may, for example, represent "0", whereas a low resistance represents "1", or vice versa. The memory status detection may also be carried out using sensing voltages.

Figure 2:
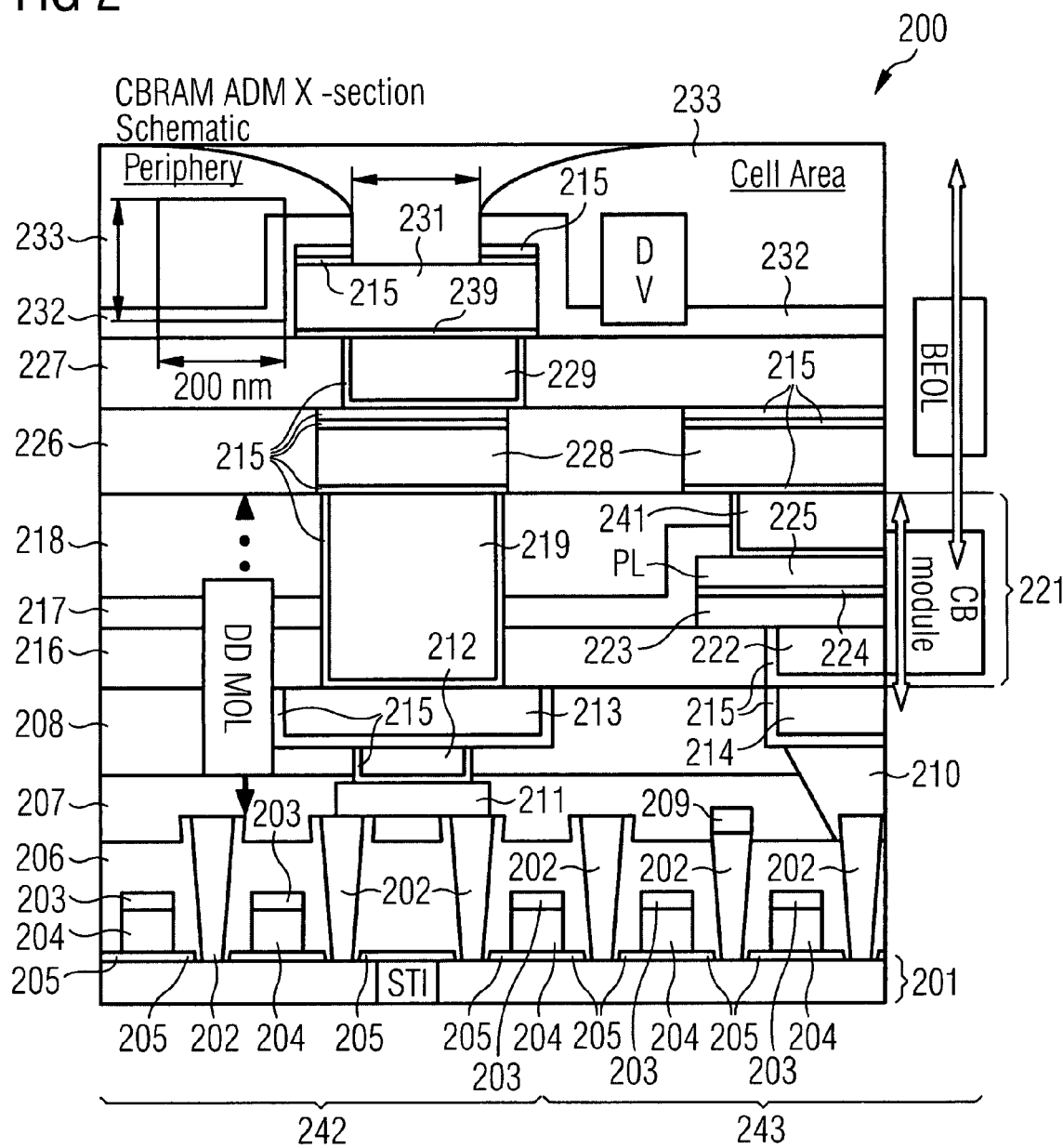
FIG. 2 shows a schematic cross-sectional view of a part of a solid electrolyte memory device according to one embodiment of the present invention.

FIG. 2 shows an embodiment 200 of a solid electrolyte memory device. A solid electrolyte memory device 200 includes a semiconductor substrate 201, above which first vias 202, word lines 203, gate electrodes 204, first isolation elements 205 and a first isolation layer 206 are provided, the first vias 202, word lines 203 and gate electrodes 204 being embedded into the first isolation layer 206 in order to isolate the first vias 202, word lines 203 and gate electrodes 204 against each other. The first isolation elements 205 isolate the gate electrodes 204 against the semiconductor substrate 201.

The solid electrolyte memory device 200 further comprises a second isolation layer 207 and a third isolation layer 208 arranged in this order on the first isolation layer 206. Bit lines 209 which contact first vias 202, second vias 210, a first wiring layer 211, a first plug 212, a second plug 213, and a third plug 214 are embedded into the second isolation layer 207 and the third isolation layer 208. The first plug 212, the second plug 213, and the third plug 214 are partly surrounded by interface material 215 which may be adhesive material and/or conductive material and/or insulating material. A fourth isolation layer 216, a fifth isolation layer 217, and a sixth isolation layer 218 are arranged on the third isolation layer 208 in this order. A third via 219 partially surrounded by interface material 215 (for example, tantalum or tantalum nitride (Ta/TaN)) is embedded into the composite structure formed by the fourth isolation layer 216, the fifth isolation layer 217, and the sixth isolation layer 218. Further, a solid electrolyte cell unit 221 is embedded into said composite structure. The solid electrolyte cell unit 221 comprises a fourth plug 222 functioning as bottom electrode of the solid electrolyte cell unit 221 and being partially surrounded by interface material 215, a layer of active material 223 (for example, chalcogenide material), a common top electrode layer 224 (for example, a silver layer) arranged on the active material layer 223, a common contacting layer 225 arranged on the common top electrode layer 224, and a fifth plug 241 being arranged on the common contacting layer 225 and being partially surrounded by the interface material 215. A seventh isolation layer 226 and an eighth isolation layer 227 are arranged on the sixth isolation layer 218 in this order. A second wiring layer 228 is embedded into the seventh isolation layer 226 and is partially surrounded by interface material 215. A sixth plug 229 is embedded into the eighth isolation layer 227 and is partially surrounded by interface material 215. A third wiring layer 231 is arranged on the eighth isolation layer 227 and is partially surrounded by interface material 215. The upper surface of the eighth isolation layer 227 as well as parts of the surface of the third wiring layer 231 are covered with a ninth isolation layer 232 and a tenth isolation layer 233.

The third wiring layer 231, the sixth plug 229, the second wiring layer 228, the third via 219, the second plug 213, the first plug 212, the first wiring layer 211, and some of the first vias 202 may be connected in a way that a conductive line is formed which guides electric currents between the semiconductor substrate 201 of the solid electrolyte memory device 200 and a substrate voltage/current terminal which is formed by the upper surface of the third wiring layer 231.

The fifth plug 241 and the second wiring layer 228 may be connected in a way that a conductive line is formed which guides electric currents or voltages between the common contacting layer 225 and a memory cell programming unit (not shown here) programming memory states of the memory cells or between the common contacting layer 225 and a memory cell reading unit (not shown here) determining the memory state of the memory cells. For sake of simplicity, only one fifth plug 241 is shown. However, a plurality of fifth plugs 241 may be provided, each fifth plug 241 being part of a conductive line guiding electric currents or voltages between the common contacting layer 225 and a memory cell programming unit/a memory cell reading unit. Further, the common contacting layer 225 and the common top electrode layer 224 may be patterned.

The third wiring layer 231, the sixth plug 229, the second wiring layer 228, the third via 219, the second plug 213, the first plug 212, and the first wiring layer 211 are located within a peripheral area 242 of the solid electrolyte memory device 200, whereas the fifth plug 241 and the second wiring layer 228 are located within a cell area 243 of the solid electrolyte memory device 200.

Figure 3A:
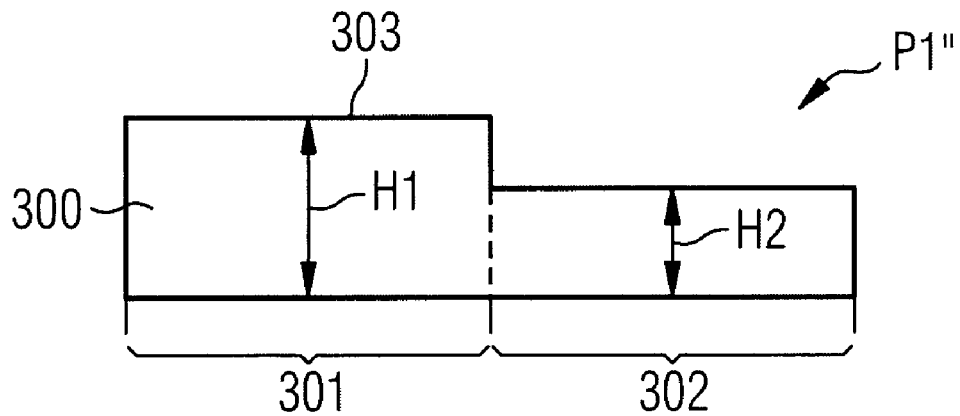
FIG. 3a shows a cross-sectional view of a processing state of a method of fabricating a solid electrolyte memory device according to one embodiment of the present invention.
Figure 3B:
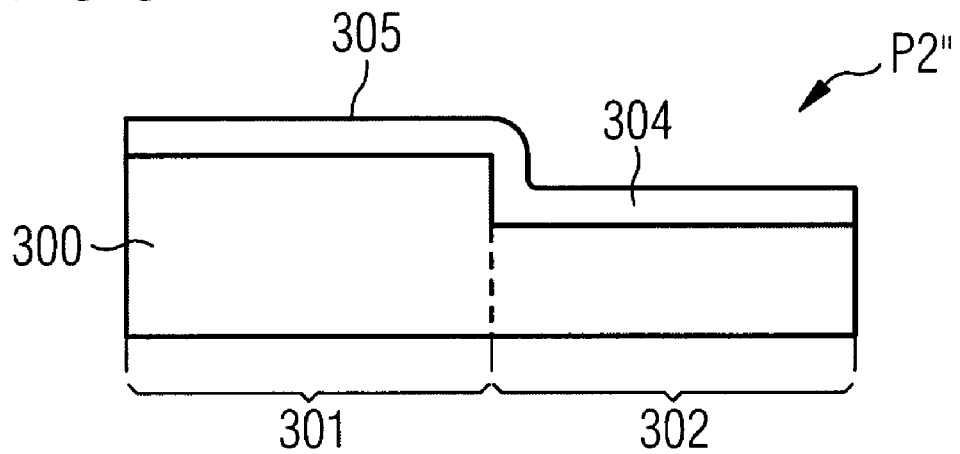
FIG. 3b shows a cross-sectional view of a processing state of a method of fabricating a solid electrolyte memory device according to one embodiment of the present invention.
Figure 3C:
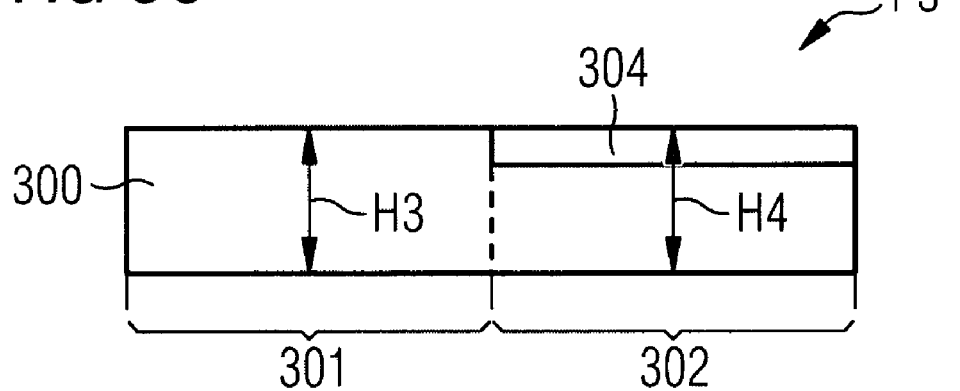
FIG. 3c shows a cross-sectional view of a processing state of a method of fabricating a solid electrolyte memory device according to one embodiment of the present invention.

In the following description, making reference to FIGS. 3a to 3c, a method of manufacturing a memory device according to one embodiment of the present invention will be explained.

In a first process P1", a solid electrolyte layer 300 comprising a first solid electrolyte layer area 301 and a second solid electrolyte layer area 302 is provided. The top surface 303 of the solid electrolyte layer 300 has a first height H1 within the first solid electrolyte layer area 301 and a second height H2 within the second solid electrolyte layer area 302. As a consequence, the top surface 303 shows a step at the border between the first solid electrolyte layer area 301 and the second solid electrolyte layer area 302.

In a second process P2", a conductive layer 304 is provided on the top surface 303 of the solid electrolyte layer 300. The conductive layer 304 has a uniform thickness. Therefore, the top surface of the conductive layer 304 also shows a step near the border between the first solid electrolyte layer area 301 and the second solid electrolyte layer area 302.

In a third process P3", the top surface 305 of the conductive layer 304 is planarized. The planarization process is carried out such that the solid electrolyte layer 300 is exposed within the first solid electrolyte layer area 301, however is covered by the conductive layer 304 within the second solid electrolyte layer area 302. In this way, the conductive layer 304 is completely removed within the first solid electrolyte layer area 301. FIG. 3c shows the case where the height H3 of the top surface of the solid electrolyte layer 300 within the first solid electrolyte layer area 301 equals the height H4 of the top surface of the conductive layer 304 within the second solid electrolyte layer area 302. However, the present invention is not restricted thereto: the height H3 may also be larger than the height H4 (which may be the case if the thickness of the conductive layer 304 is smaller than the height of the step at the border between the first solid electrolyte layer area 301 and the second solid electrolyte layer area 302), i.e. the term "planarization of the top surface of the conductive layer" also includes the case that the result of the "planarization process" is a top surface of the solid electrolyte layer 300/the conductive layer 304 having different heights within the first solid electrolyte layer area 301 and the second solid electrolyte layer area 302.

In a further process (not shown), the solid electrolyte layer 300 may be patterned within the first solid electrolyte layer area 301, i.e. within the area where the top surface of the solid electrolyte layer 300 is not covered by the conductive layer 304. This patterning process may, for example, be carried out using etching substances which chemically only react with the solid electrolyte layer 300, but not with the conductive layer 304.

Figure 4:
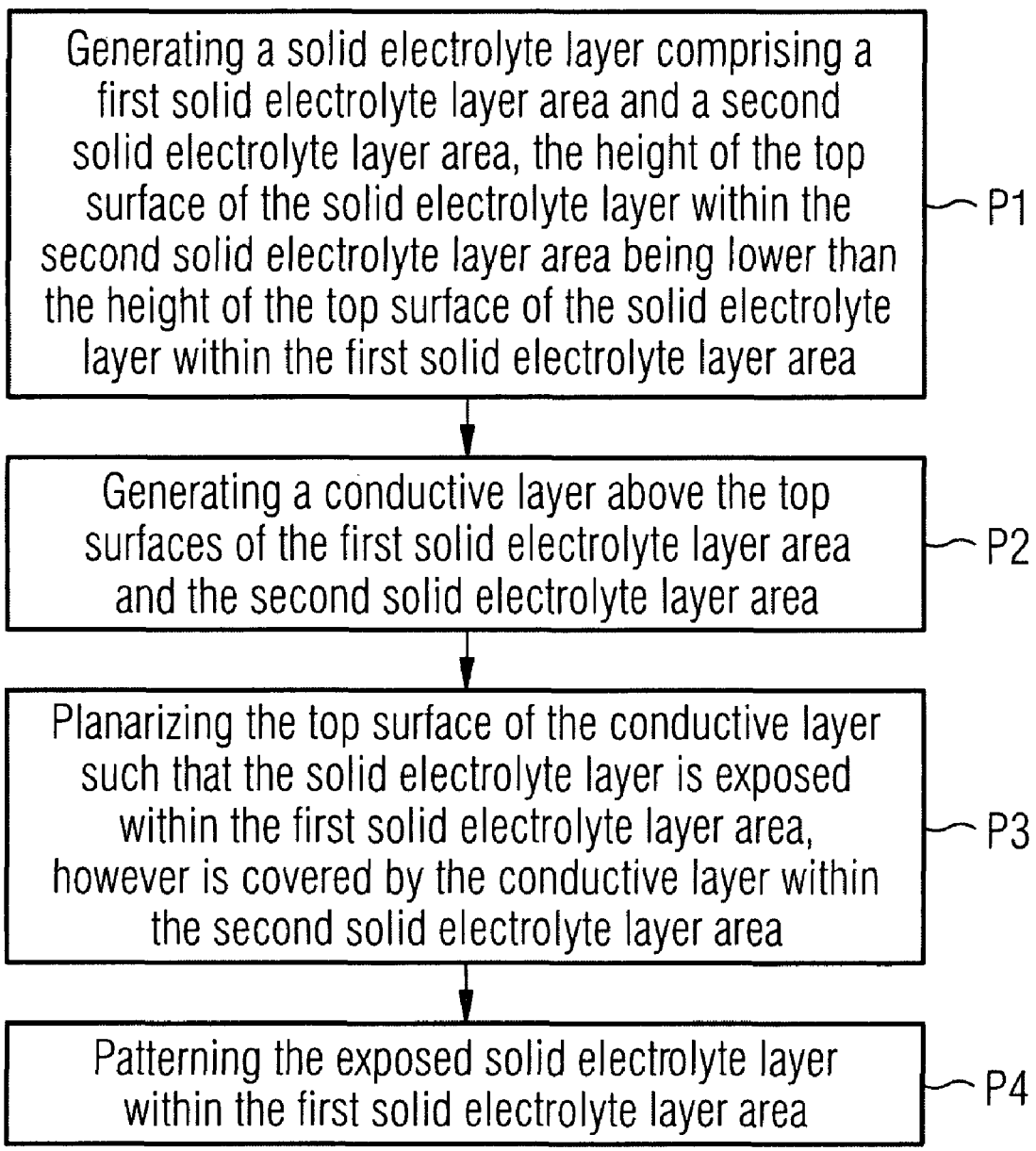
FIG. 4 shows a flow chart diagram of a method of fabricating a solid electrolyte memory device according to one embodiment of the present invention.

FIG. 4 shows a method of fabricating a memory device according to one embodiment of the present invention.

In a first process P1, a solid electrolyte layer is generated including a first solid electrolyte layer area and a second solid electrolyte layer area, the height of the top surface of the solid electrolyte layer within the second solid electrolyte layer area being lower than the height of the top surface of the solid electrolyte layer within the first solid electrolyte layer area.

In a second process P2, a conductive layer is generated above the top surfaces of the first solid electrolyte layer area and the second solid electrolyte layer area.

In a third process P3, the top surface of the conductive layer is planarized such that the solid electrolyte layer is exposed within the first solid electrolyte layer area, however is covered by the conductive layer within the second solid electrolyte layer area.

In a fourth process P4, the exposed solid electrolyte layer is patterned within the first solid electrolyte layer area.

Figure 5:
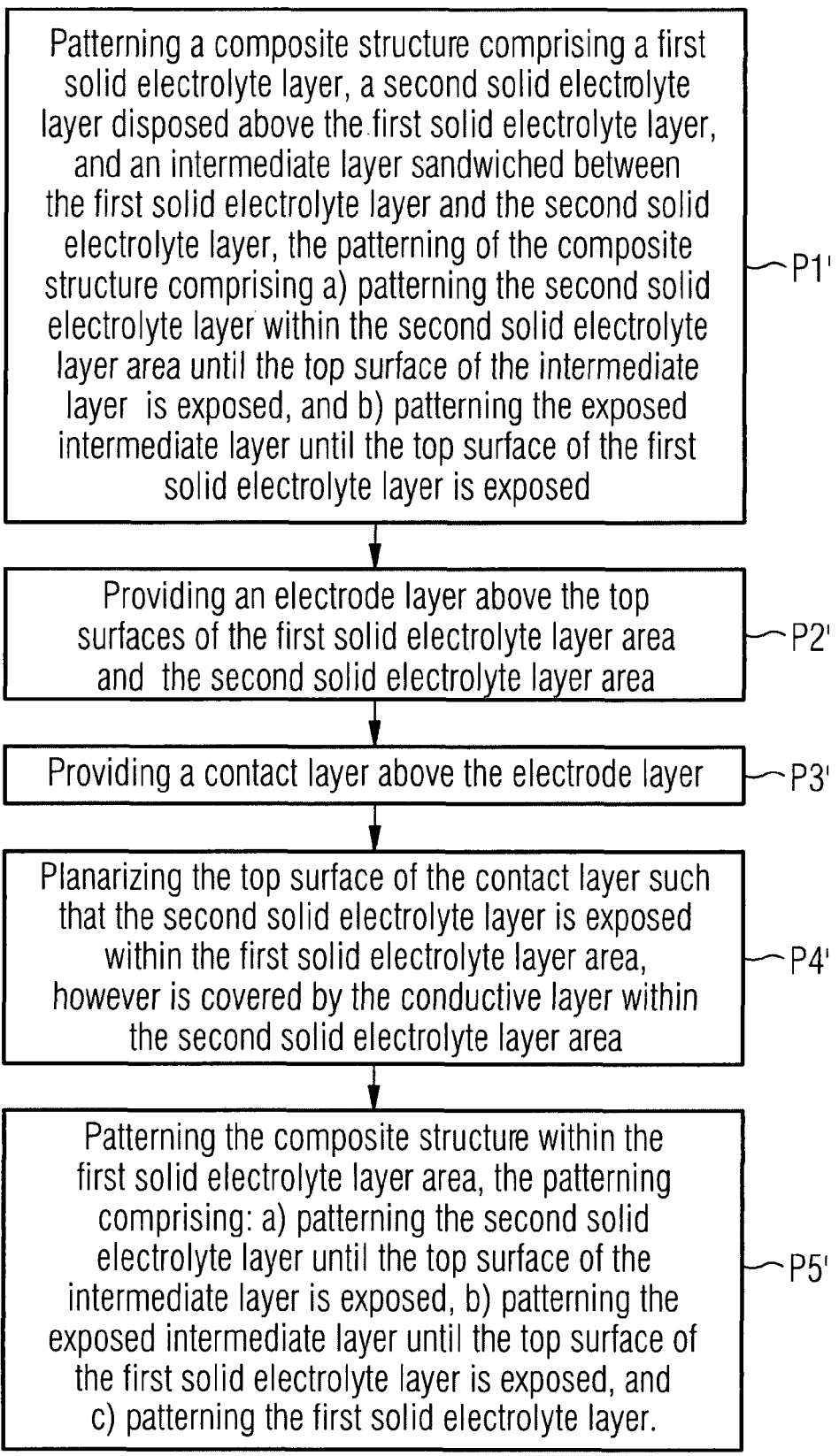
FIG. 5 shows a flow chart diagram of a method of fabricating a solid electrolyte memory device according to one embodiment of the present invention.

FIG. 5 shows a method of manufacturing a memory device according to one embodiment of the present invention.

In a first process P1', a composite structure is patterned including a first solid electrolyte layer, a second solid electrolyte layer disposed above the first solid electrolyte layer and an intermediate layer sandwiched between the first solid electrolyte layer and the second solid electrolyte layer. The patterning of the composite structure includes: a) patterning the second solid electrolyte layer within the second solid electrolyte layer area until the top surface of the intermediate layer is exposed, and b) patterning the exposed intermediate layer until the top surface of the first solid electrolyte layer is exposed.

In a second process P2', an electrode layer is provided above the top surfaces of the first solid electrolyte layer area and the second solid electrolyte layer area.

In a third process P3', a contact layer is provided above the electrode layer.

In a fourth process P4', the top surface of the contact layer is planarized such that the second solid electrolyte layer is exposed within the first solid electrolyte layer area, however is covered by the conductive layer within the second solid electrolyte layer area.

In a fifth process P5', the composite structure is patterned within the first solid electrolyte layer area, wherein the patterning includes: a) patterning the second solid electrolyte layer until the top surface of the intermediate layer is exposed, b) patterning the exposed intermediate layer until the top surface of the first solid electrolyte layer is exposed, and c) patterning the first solid electrolyte layer.

In the following description, making reference to FIGS. 6a to 6e, a method of manufacturing a memory device will be explained which may be interpreted as one possible realization of the manufacturing method shown in FIGS. 3a to 3c.

Figure 6A:
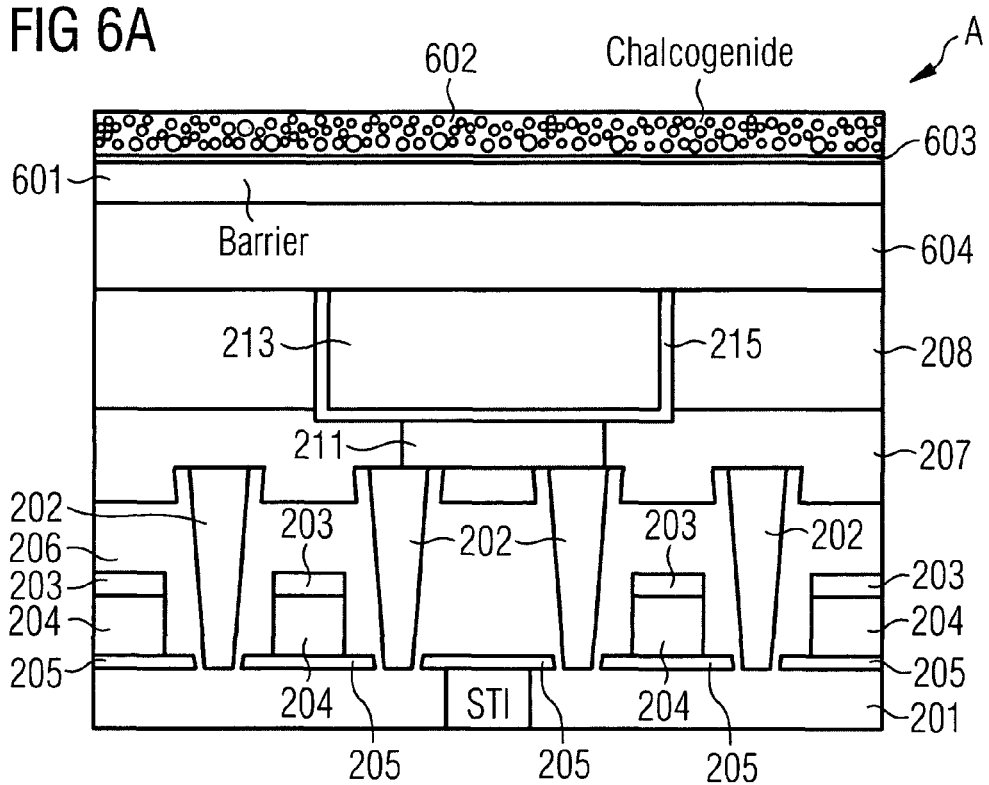
FIG. 6a shows a cross-sectional view of a processing state of a method of fabricating a solid electrolyte memory device according to one embodiment of the present invention.

FIG. 6a shows a first processing state A in which a first solid electrolyte layer 601, a second solid electrolyte layer 602, and an intermediate layer 603 sandwiched between the first solid electrolyte layer 601 and the second solid electrolyte layer 604 have been provided on an isolation layer 604 in this order. The first solid electrolyte layer 601 and the second solid electrolyte layer 602 may, for example, comprise or consist of chalcogenide. The thickness of the first solid electrolyte layer 601 may, for example, range from 10 nm to 100 nm or from 30 nm to 100 nm. In the same way, the thickness of the second solid electrolyte layer 602 may, for example, range from 10 nm to 100 nm or from 30 nm to 100 nm. The intermediate layer 603 may, for example, comprise or consist of nitride or SiC. The thickness of the intermediate layer 603 may, for example, range from 10 Angstrom to 100 Angstrom.

Figure 6B:
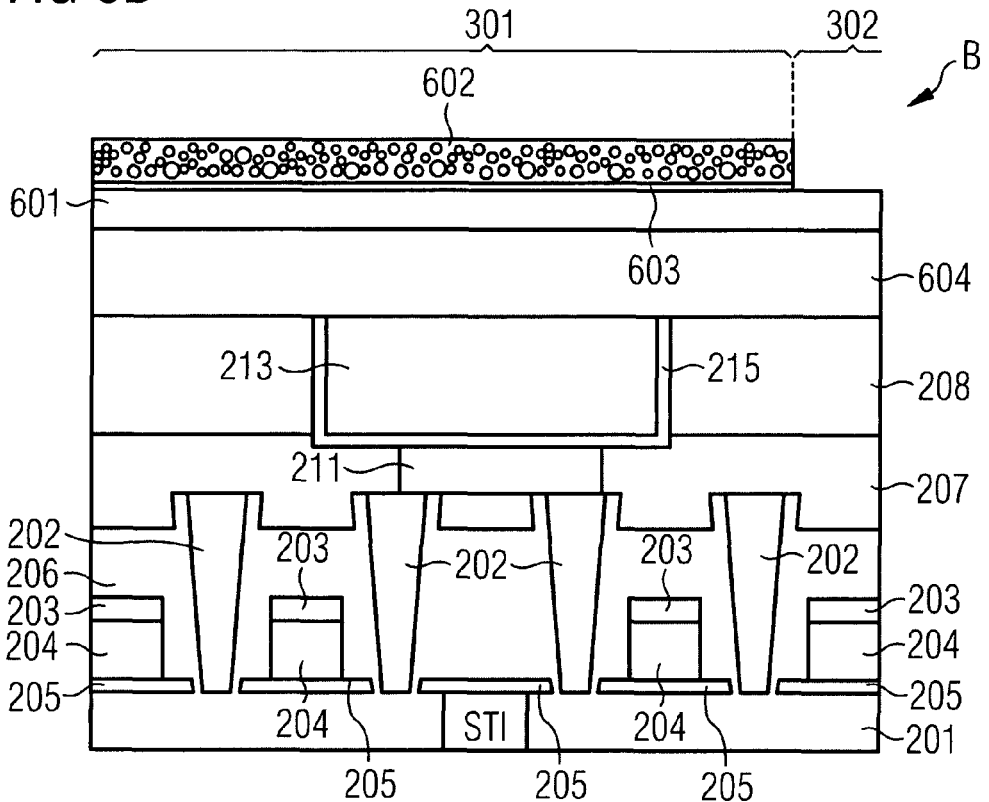
FIG. 6b shows a cross-sectional view of a processing state of a method of fabricating a solid electrolyte memory device according to one embodiment of the present invention.

In a second processing state B shown in FIG. 6b, the second solid electrolyte layer 602 as well as the intermediate layer 603 are removed within a second solid electrolyte layer area 302, whereas these layers 602, 603 are not removed within a first solid electrolyte layer area 301. In order to remove the second solid electrolyte layer 602 and the intermediate layer 603 within the second solid electrolyte layer area 302, an etching process following a lithographic process may be carried out. The etching process may comprise two steps: in a first step, a first etching substance may be used which only etches the second solid electrolyte layer 602, however does not etch the intermediate layer 603, i.e., the intermediate layer 603 functions as an etching barrier. Then, in a second step, the intermediate layer 603 may be etched using a second etching substance which only etches the intermediate layer 603, however does not etch the first solid electrolyte layer 601 arranged below the intermediate layer 603.

Figure 6C:
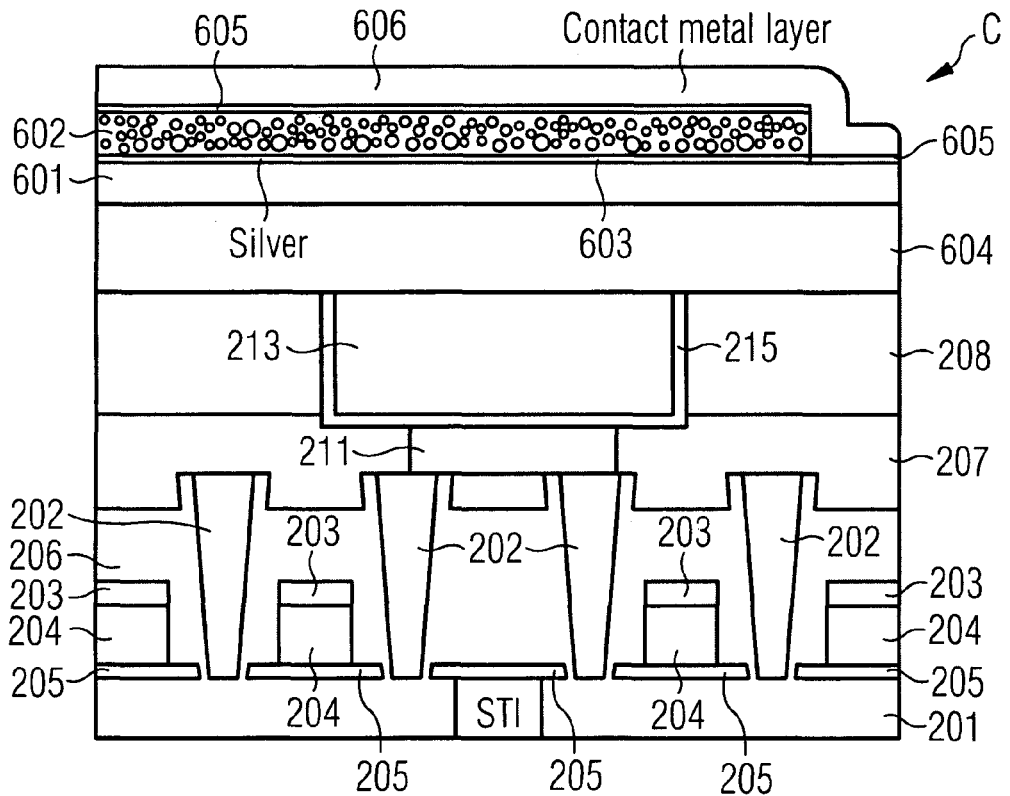
FIG. 6c shows a cross-sectional view of a processing state of a method of fabricating a solid electrolyte memory device according to one embodiment of the present invention.

In a third processing state C shown in FIG. 6c, an electrode layer 605 has been provided on the top surface of the structure shown in FIG. 6b, i.e. on the top surfaces of the second solid electrolyte layer 602 within the first solid electrolyte layer area 301, and the top surface of the first solid electrolyte layer 601 within the second solid electrolyte layer area 302. Further, a contact layer 606 has been provided on the top surface of the electrode layer 605. The electrode layer 605 may, for example, comprise or consist of silver (Ag). The thickness of the electrode layer 605 may, for example, range between 10 Angstrom and 100 Angstrom. The thickness of the contact layer 606 may, for example, range between 50 nm and 300 nm.

Figure 6D:
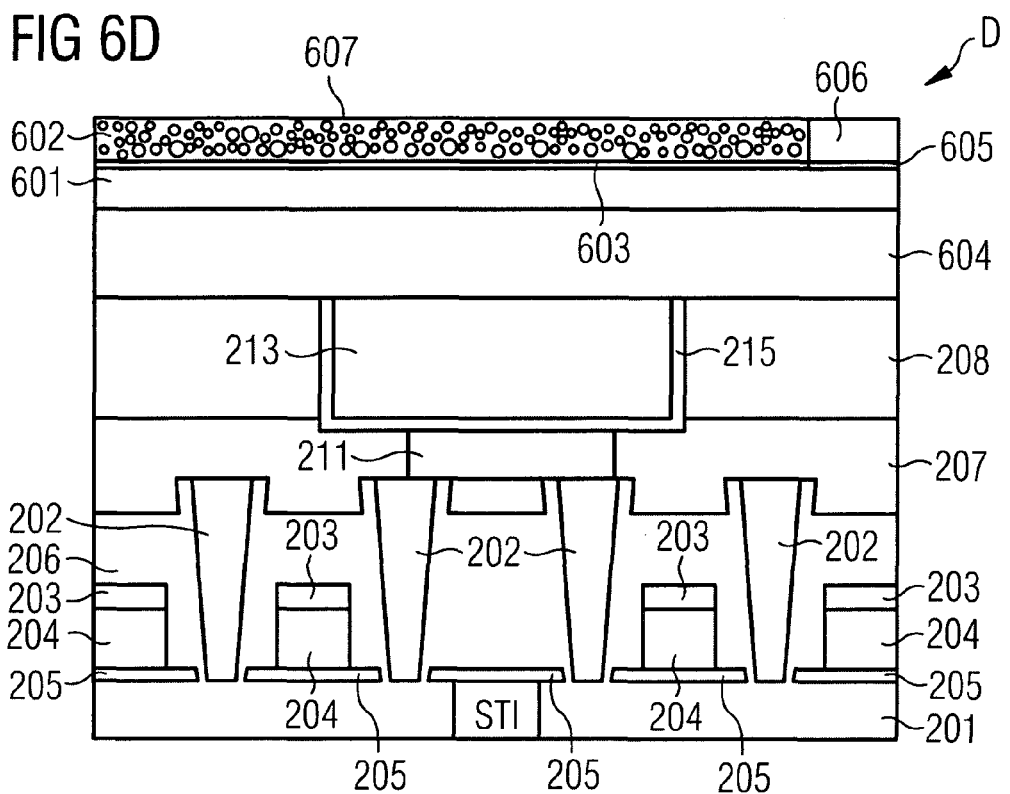
FIG. 6d shows a cross-sectional view of a processing state of a method of fabricating a solid electrolyte memory device according to one embodiment of the present invention.

In a fourth processing state D shown in FIG. 6d, a structure having a planarized top surface 607 is shown, which is obtained by subjecting the top surface of the structure shown in FIG. 6c to a planarization process. The planarization process is carried out at least until the top surface of the second solid electrolyte layer 602 has been exposed within the first solid electrolyte layer area 301. Here, additionally, the upper part of the second solid electrolyte layer 602 has been removed (until the height of the top surface of the planarized second solid electrolyte layer 602 within the first solid electrolyte layer area 301 equals the height of the top surface of the contact layer 606 within the second solid electrolyte layer area 302).

In a fifth processing state E shown in FIG. 6e, the first solid electrolyte layer 601, the second solid electrolyte layer 602 as well as the intermediate layer 603 have been removed within the first solid electrolyte layer area 301. In order to remove these layers 601, 602, and 603, an etching process may be carried out, for example. The etching substance used for carrying out the etching process may be a substance suitable to etch the first solid electrolyte layer 601, the second solid electrolyte layer 602, and the intermediate layer 603. Alternatively, three different etching processes may be performed, wherein each etching process uses an etching substance which selectively only etches one of these layers.

As shown in FIGS. 7A and 7B, in some embodiments, memory devices such as those described herein may be used in modules. In FIG. 7A, a memory module 700 is shown, on which one or more memory devices/integrated circuits 704 according to one embodiment of the present invention are arranged on a substrate 702. The memory device/integrated circuits 704 may include numerous memory cells. The memory module 700 may also include one or more electronic devices 706, which may include memory, processing circuitry, control circuitry, addressing circuitry, bus interconnection circuitry, or other circuitry or electronic devices that may be combined on a module with a memory device, such as the memory devices/integrated circuits 704. Additionally, the memory module 700 includes multiple electrical connections 708, which may be used to connect the memory module 700 to other electronic components, including other modules.

As shown in FIG. 7B, in some embodiments, these modules may be stackable, to form a stack 750. For example, a stackable memory module 752 may contain one or more memory devices 756, arranged on a stackable substrate 754. The memory device 756 contains memory cells that employ memory elements in accordance with an embodiment of the invention. The stackable memory module 752 may also include one or more electronic devices 758, which may include memory, processing circuitry, control circuitry, addressing circuitry, bus interconnection circuitry, or other circuitry or electronic devices that may be combined on a module with a memory device, such as the memory device 756. Electrical connections 760 are used to connect the stackable memory module 752 with other modules in the stack 750, or with other electronic devices. Other modules in the stack 750 may include additional stackable memory modules, similar to the stackable memory module 752 described above, or other types of stackable modules, such as stackable processing modules, control modules, communication modules, or other modules containing electronic components.

According to one embodiment of the present invention, the reliability of integrated circuits having a memory device is improved.

In the following description, further features of the present invention will be explained.

Under current processing, the CBRAM process includes a silver layer on top of the chalcogenide layer. The way to pattern the chalcogenide is done by an etching process including the etching of silver. The actual etching process is carried out using Ar plasma, a lot of residue is still present after the etching process; the etching process is not selective, and a huge pattern factor issue exists.

According to one embodiment of the present invention, a new solution is provided in order to pattern the chalcogenide, a deposition of a thicker chalcogenide followed by the inverse patterning of the chalcogenide; deposition of silver and the cap layer (also photo dissolution) and the contacting layer like tungsten; performing a CMP process stopping on the contacting layer; and finally selectively etching the chalcogenide: no silver etch is required. The actual process is a process using the etch integration scheme.

According to one embodiment of the present invention, a new PL Level integration scheme is provided. The new integration scheme uses, thicker chalcogenide with etch barrier (sandwich chalcogenide, barrier, chalcogenide); inverse litho-etch patterning; Silver+Cap layer deposition+Photo dissolution; contact layer deposition; CMP layer planarization; selective chalcogenide etch According to one embodiment of the present invention, a new PL Level integration scheme is provided. The new integration scheme uses, Litho+Etch to the barrier; selective etch of the barrier; chalcogenide surface clean; silver deposition+ Cap; photo dissolution; contact metal deposition (like W); CMP to contact metal; selective chalcogenide etch stop on barrier (Nitride or SiC); provide uniformity; barrier etch; selective chalcogenide etch stop on oxide.

As used herein, the terms "connected" and "coupled" are intended to include both direct and indirect connection and coupling, respectively.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A method of manufacturing an integrated circuit comprising a memory device, the method comprising:
    forming a solid electrolyte layer comprising a first solid electrolyte layer area having a substantially first thickness and a second solid electrolyte layer area having a substantially second thickness, the second thickness being lower than the first thickness, wherein the solid electrolyte layer comprises a solid electrolyte layer composite structure comprising a first solid electrolyte layer, a second solid electrolyte layer disposed above the first solid electrolyte layer, and an intermediate layer sandwiched between the first solid electrolyte layer and the second solid electrolyte layer;
    forming a conductive layer on or above top surfaces of the first solid electrolyte layer area and the second solid electrolyte layer area;
    planarizing a top surface of the conductive layer such that the solid electrolyte layer is exposed within the first solid electrolyte layer area but is covered by the conductive layer within the second solid electrolyte layer area; and
    patterning the exposed solid electrolyte layer within the first solid electrolyte layer area.

2. The method according to claim 1, wherein portions of the solid electrolyte layer and the conductive layer located within the second solid electrolyte layer area constitute at least a part of at least one memory cell of the memory device.

3. The method according to claim 1, wherein forming the solid electrolyte layer comprises a process of patterning a solid electrolyte layer having a top surface of a uniform height such that the height of the top surface of the solid electrolyte layer within the second solid electrolyte layer area becomes lower than the height of the top surface of the solid electrolyte layer within the first solid electrolyte layer area.

4. The method according to claim 1, wherein patterning the exposed solid electrolyte layer is carried out such that the solid electrolyte layer is completely removed within the first solid electrolyte layer area.

5. The method according to claim 1, wherein planarizing the top surface of the conductive layer is carried out using a chemical mechanical polishing process.

6. The method according to claim 1, wherein forming the solid electrolyte layer comprises:
    patterning the second solid electrolyte layer within the second solid electrolyte layer area until the top surface of the intermediate layer is exposed; and
    patterning the exposed intermediate layer until the top surface of the first solid electrolyte layer is exposed.

7. The method according to claim 6, wherein patterning the exposed solid electrolyte layer within the first solid electrolyte layer comprises:
    patterning the second solid electrolyte layer within the first solid electrolyte layer area until the top surface of the intermediate layer is exposed;
    patterning the exposed intermediate layer within the first solid electrolyte layer area until the top surface of the first solid electrolyte layer is exposed; and
    patterning the first solid electrolyte layer.

8. The method according to claim 1, wherein, after forming the conductive layer, a photo dissolution process and/or a thermal dissolution process is carried out driving metal ions out of the conductive layer into the solid electrolyte layer.

9. The method according to claim 1, wherein the conductive layer comprises an electrode layer and a contact layer disposed on or above the electrode layer.

10. The method according to claim 9, wherein, after having provided the electrode layer, a photo dissolution process and/or a thermal dissolution process is carried out driving metal ions out of the electrode layer into the solid electrolyte layer.

11. The method according to claim 1, wherein the intermediate layer comprises nitride or SiC.

12. The method according to claim 9, wherein the electrode layer comprises silver.

13. The method according to claim 1, wherein the solid electrolyte layer comprises chalcogenide.

14. method according to claim 1, wherein the thickness of the second solid electrolyte layer ranges from 10 nm to 100 nm.

15. The method according to claim 1, wherein the thickness of the second solid electrolyte layer ranges from 10 nm to 100 nm.

16. The method according to claim 1, wherein the thickness of the intermediate layer ranges from 10 Angstrom to 100 Angstrom.

17. The method according to claim 9, wherein the thickness of the contact layer ranges from 50 nm to 300 nm.

18. The method according to claim 9, wherein the thickness of the electrode layer ranges from 10 Angstrom to 100 Angstrom.

19. The method according to claim 6, further comprising patterning the second solid electrolyte layer using an etching process, wherein the intermediate layer serves as an etching barrier during the etching process.

20. The method according to claim 1, wherein the thickness of the first solid electrolyte layer corresponds to a target thickness of solid electrolyte layers of memory cells of the memory device.

21. A method of manufacturing an integrated circuit comprising a memory device, the method comprising:
    forming a solid electrolyte layer comprising a first solid electrolyte layer area and a second solid electrolyte layer area, a height of a top surface of the solid electrolyte layer within the second solid electrolyte layer area being lower than a height of a top surface of the solid electrolyte layer within the first solid electrolyte layer area, wherein the solid electrolyte layer comprises a solid electrolyte layer composite structure comprising a first solid electrolyte layer, a second solid electrolyte layer disposed above the first solid electrolyte layer, and an intermediate layer sandwiched between the first solid electrolyte layer and the second solid electrolyte layer;

forming a conductive layer on or above the top surfaces of the first solid electrolyte layer area and the second solid electrolyte layer area;

planarizing the top surface of the conductive layer such that the solid electrolyte layer is exposed within the first solid electrolyte layer area but is covered by the conductive layer within the second solid electrolyte layer area; and patterning the exposed solid electrolyte layer within the first solid electrolyte layer area.

22. The method according to claim 21, wherein forming the solid electrolyte layer comprises:

patterning the second solid electrolyte layer within the second solid electrolyte layer area until the top surface of the intermediate layer is exposed; and patterning the exposed intermediate layer until the top surface of the first solid electrolyte layer is exposed.

23. The method according to claim 22, wherein patterning the exposed solid electrolyte layer within the first solid electrolyte layer comprises:

patterning the second solid electrolyte layer within the first solid electrolyte layer area until the top surface of the intermediate layer is exposed;

patterning the exposed intermediate layer within the first solid electrolyte layer area until the top surface of the first solid electrolyte layer is exposed; and patterning the first solid electrolyte layer.

24. The method according to claim 21, wherein the intermediate layer comprises nitride or SiC.

25. The method according to claim 21, wherein the electrode layer comprises silver.

26. The method according to claim 21, wherein the solid electrolyte layer comprises chalcogenide.

27. The method according to claim 21, wherein the thickness of the first solid electrolyte layer ranges from 10 nm to 100 nm.

28. The method according to claim 21, wherein the thickness of the second solid electrolyte layer ranges from 10 nm to 100 nm.

29. The method according to claim 21, wherein the thickness of the intermediate layer ranges from 10 Angstrom to 100 Angstrom.

30. The method according to claim 22, further comprising patterning the second solid electrolyte layer using an etching process, wherein the intermediate layer serves as an etching barrier during the etching process.

31. The method according to claim 21, wherein the thickness of the first solid electrolyte layer corresponds to a target thickness of solid electrolyte layers of memory cells of the memory device.

\* \* \* \* \*

UNITED STATES PATENT AND TRADEMARK OFFICE
CERTIFICATE OF CORRECTION

| | | |
|---|---|---|
| PATENT NO. | : 7,888,228 B2 | Page 1 of 1 |
| APPLICATION NO. | : 11/784206 | |
| DATED | : February 15, 2011 | |
| INVENTOR(S) | : Blanchard | |

It is certified that error appears in the above-identified patent and that said Letters Patent is hereby corrected as shown below:

In Col. 12, line 39, claim 14, delete "second" and insert --first--.

Signed and Sealed this
Twelfth Day of April, 2011

David J. Kappos
*Director of the United States Patent and Trademark Office*